United States Patent
Hanyu et al.

(10) Patent No.: US 10,090,332 B2
(45) Date of Patent: Oct. 2, 2018

(54) SEMICONDUCTOR DEVICE AND DISPLAY DEVICE HAVING DISSIMILAR SEMICONDUCTOR LAYERS

(71) Applicant: Japan Display Inc., Minato-ku (JP)

(72) Inventors: Yuichiro Hanyu, Tokyo (JP); Hirokazu Watanabe, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/620,997

(22) Filed: Jun. 13, 2017

(65) Prior Publication Data

US 2017/0358610 A1    Dec. 14, 2017

(30) Foreign Application Priority Data

Jun. 14, 2016  (JP) ................. 2016-118052

(51) Int. Cl.
*H01L 27/12* (2006.01)
*H01L 29/78* (2006.01)
*H01L 51/05* (2006.01)
*H01L 29/786* (2006.01)

(52) U.S. Cl.
CPC ...... *H01L 27/1225* (2013.01); *H01L 27/1251* (2013.01); *H01L 27/1229* (2013.01); *H01L 27/1233* (2013.01); *H01L 29/7869* (2013.01); *H01L 51/0529* (2013.01)

(58) Field of Classification Search
CPC ............. H01L 27/1225; H01L 27/1251; H01L 27/1233; H01L 27/1229; H01L 29/7869; H01L 51/0529
See application file for complete search history.

(56) References Cited

U.S. PATENT DOCUMENTS

| | | | | |
|---|---|---|---|---|
| 6,803,600 B2 * | 10/2004 | Yamazaki | ......... | H01L 21/76897 257/59 |
| 7,199,061 B2 * | 4/2007 | Choi | ................. | H01L 21/02164 257/E21.19 |
| 8,581,260 B2 * | 11/2013 | Yamazaki | ............. | H01L 27/105 257/59 |
| 8,629,504 B2 * | 1/2014 | Doris | ..................... | H01L 21/84 257/350 |
| 8,643,008 B2 * | 2/2014 | Yamazaki | ........... | H01L 27/1225 257/223 |
| 8,664,658 B2 * | 3/2014 | Yoneda | ............... | H01L 21/8258 257/369 |
| 8,673,426 B2 * | 3/2014 | Yamazaki | ............. | G11C 19/28 428/142 |

(Continued)

FOREIGN PATENT DOCUMENTS

JP    2015-144265    8/2015

*Primary Examiner* — Ida M Soward
(74) *Attorney, Agent, or Firm* — Oblon, McClelland, Maier & Neustadt, L.L.P.

(57) ABSTRACT

According to one embodiment, a semiconductor device includes a first insulating film, a first semiconductor layer formed of polycrystalline silicon, a second semiconductor layer formed of an oxide semiconductor, a second insulating film, a first gate electrode, a second gate electrode, a third insulating film formed of silicon nitride, and a protection layer. The protection layer is located between the second insulating film and the third insulating film, is opposed to the second semiconductor layer, and is formed of either an aluminum oxide or fluorinated silicon nitride.

12 Claims, 3 Drawing Sheets

(56) References Cited

U.S. PATENT DOCUMENTS

| | | | | |
|---|---|---|---|---|
| 8,692,243 | B2* | 4/2014 | Kamata | H01L 21/76254 |
| | | | | 257/43 |
| 8,860,295 | B2* | 10/2014 | Kim | H01L 27/3272 |
| | | | | 313/498 |
| 8,937,304 | B2* | 1/2015 | Fujita | H01L 21/84 |
| | | | | 257/43 |
| 9,048,277 | B2* | 6/2015 | Oikawa | H01L 23/293 |
| 9,147,462 | B2* | 9/2015 | Koyama | G11C 11/412 |
| 9,178,005 | B2* | 11/2015 | Kim | H01L 27/326 |
| 9,184,185 | B2* | 11/2015 | Yamazaki | H01L 27/1225 |
| 9,196,737 | B2* | 11/2015 | Zhan | H01L 29/78672 |
| 9,224,757 | B2* | 12/2015 | Takahashi | H01L 27/1225 |
| 9,390,655 | B2* | 7/2016 | Jeong | H01L 27/3276 |
| 9,406,705 | B2* | 8/2016 | Kwon | H01L 27/1248 |
| 9,502,434 | B2* | 11/2016 | Tanaka | H01L 29/7869 |
| 9,548,306 | B2* | 1/2017 | Basker | H01L 21/823814 |
| 9,685,500 | B2* | 6/2017 | Yamazaki | H01L 29/045 |
| 9,773,810 | B2* | 9/2017 | Ieda | H01L 27/1207 |
| 2010/0120226 | A1* | 5/2010 | Yamazaki | H01L 21/76254 |
| | | | | 438/458 |
| 2013/0092927 | A1* | 4/2013 | Murai | H01L 27/1222 |
| | | | | 257/43 |
| 2015/0069391 | A1* | 3/2015 | Kanegae | H01L 27/1225 |
| | | | | 257/43 |
| 2015/0102349 | A1* | 4/2015 | Lee | H01L 27/1255 |
| | | | | 257/71 |
| 2015/0123084 | A1* | 5/2015 | Kim | H01L 27/326 |
| | | | | 257/40 |
| 2015/0187952 | A1 | 7/2015 | Yamazaki et al. | |
| 2015/0325602 | A1* | 11/2015 | Im | H01L 27/1222 |
| | | | | 257/43 |
| 2016/0049451 | A1* | 2/2016 | Lim | H01L 27/124 |
| | | | | 257/40 |
| 2016/0104758 | A1* | 4/2016 | Kim | H01L 28/60 |
| | | | | 257/40 |
| 2016/0163746 | A1* | 6/2016 | Ko | H01L 27/3265 |
| | | | | 438/39 |
| 2016/0322402 | A1* | 11/2016 | Kim | H01L 27/1255 |
| 2017/0033230 | A1 | 2/2017 | Yamazaki et al. | |
| 2018/0047764 | A1* | 2/2018 | Deng | H01L 27/1288 |
| | | | | 257/43 |

* cited by examiner

SEMICONDUCTOR DEVICE AND DISPLAY DEVICE HAVING DISSIMILAR SEMICONDUCTOR LAYERS

CROSS-REFERENCE TO RELATED APPLICATIONS

This application is based upon and claims the benefit of priority from Japanese Patent Application No. 2016-118052, filed Jun. 14, 2016, the entire contents of which are incorporated herein by reference.

FIELD

Embodiments described herein relate generally to a semiconductor device and a display device.

BACKGROUND

As a semiconductor device, for example, a display device which displays an image is known. In an active-matrix display device, a thin-film transistor (TFT) is used as a switching element of a pixel. Further, a thin-film transistor is also used as a switching element of a driver which is formed in a frame area (non-display area) on the outside of an active area (display area). As the material of a semiconductor layer of the thin-film transistor, polycrystalline silicon, an oxide semiconductor and the like are used.

DETAILED DESCRIPTION

Figure 1:
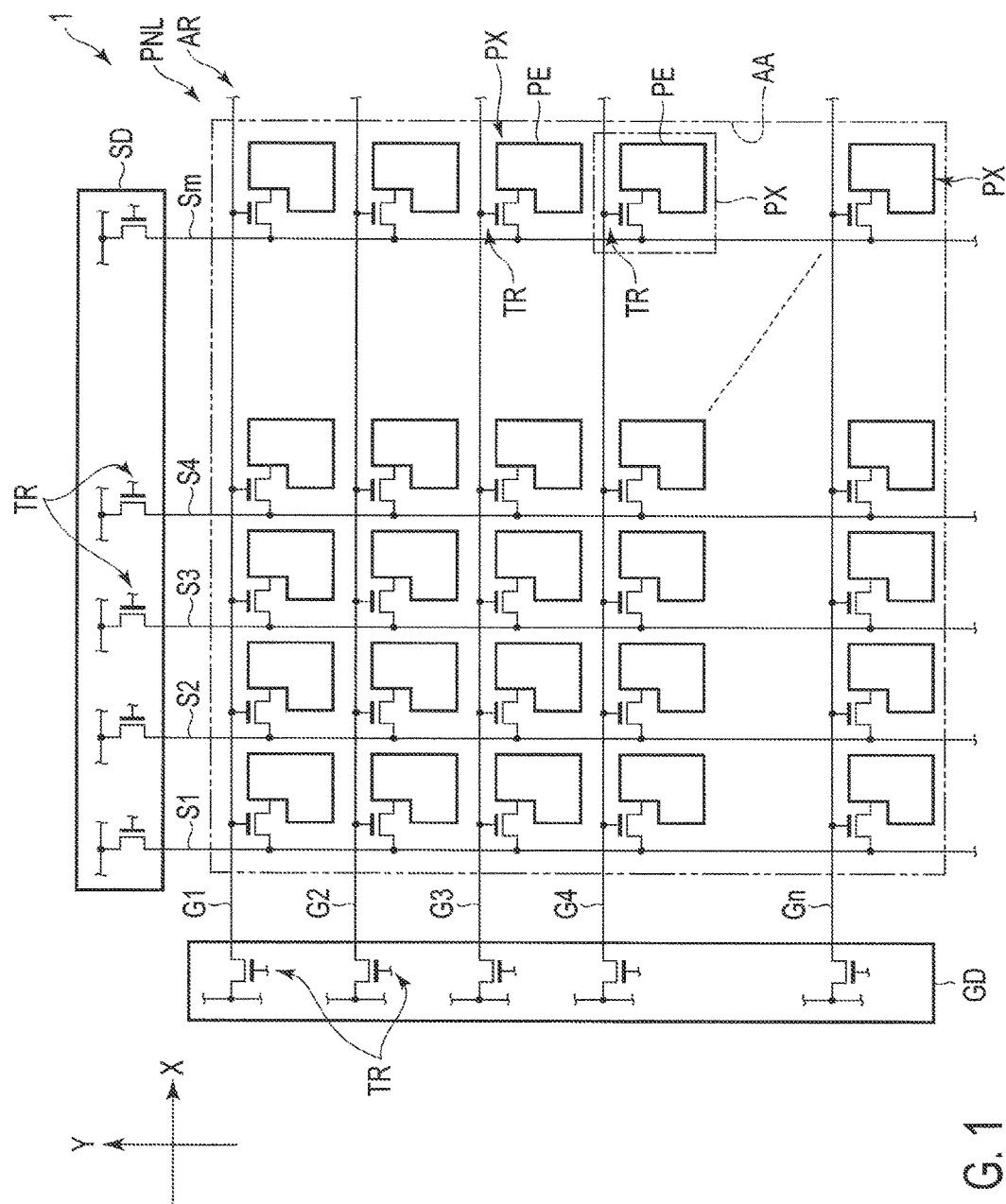
FIG. 1 is a diagram showing the structure and the equivalent circuit of a display device of a first embodiment.

In general, according to one embodiment, there is provided a semiconductor device comprising: a first insulating film; a first semiconductor layer located on the first insulating film and formed of polycrystalline silicon; a second semiconductor layer located on the first insulating film and formed of an oxide semiconductor; a second insulating film arranged on the first insulating film, the first semiconductor layer, and the second semiconductor layer; a first gate electrode located above the second insulating film and opposed to the first semiconductor layer; a second gate electrode located above the second insulating film and opposed to the second semiconductor layer; a third insulating film located above the second insulating film, the first gate electrode and the second gate electrode and formed of silicon nitride; and a protection layer located between the second insulating film and the third insulating film, opposed to the second semiconductor layer, and formed of either an aluminum oxide or fluorinated silicon nitride.

According to another embodiment, there is provided a display device comprising: a first insulating film; a first semiconductor layer located on the first insulating film and formed of polycrystalline silicon; a second semiconductor layer located on the first insulating film and formed of an oxide semiconductor; a second insulating film arranged on the first insulating film, the first semiconductor layer, and the second semiconductor layer; a first gate electrode located above the second insulating film and opposed to the first semiconductor layer; a second gate electrode located above the second insulating film and opposed to the second semiconductor layer; a third insulating film located above the second insulating film, the first gate electrode and the second gate electrode and formed of silicon nitride; and a protection layer located between the second insulating film and the third insulating film, opposed to the second semiconductor layer, and formed of either an aluminum oxide or fluorinated silicon nitride.

Each of the embodiments of the present invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

Firstly, the display device of the first embodiment will be described. FIG. 1 is a diagram showing the structure and the equivalent circuit of the display device of the first embodiment. Here, examples of a display device including a thin-film transistor are an organic electroluminescent display device, a liquid crystal display device and the like.

As shown in FIG. 1, the display device 1 includes a display area (active area) AA which displays an image, and a non-display area (frame area) on the outside of the display area. The display device 1 includes a display panel PNL. The display panel PNL includes an array substrate AR. In the display area AA, the array substrate AR includes n scanning lines G (G1 to Gn), m signal lines S (S1 to Sm), and an m by n matrix of pixels PX. Each pixel PX is defined by two adjacent scanning lines G and two adjacent signal lines S.

The scanning lines G extend substantially parallel to a first direction X. Note that the scanning lines G do not necessarily have to extend linearly. The signal lines S extend substantially parallel to a second direction Y. The signal lines S cross the scanning lines G, and for example, the signal lines S cross the scanning lines G substantially orthogonally. Note that the signal lines S do not necessarily have to extend linearly. Further, the scanning lines G and the signal lines S may be partially bent. The scanning line G and the signal line S are formed of molybdenum, chromium, tungsten, aluminum, copper, titanium, nickel, tantalum or silver, or an alloy thereof. Note that the scanning line G and the signal line S are not necessarily formed of any of these materials but may also be formed of another metal or an alloy thereof, or a laminate thereof.

Each of the scanning lines G is extended to the outside of the display area AA and connected to a scanning line drive circuit GD. Each of the signal lines S is extended to the outside of the display area AA and connected to a signal line drive circuit SD.

Each of the pixels PX includes a thin-film transistor TR and a pixel electrode PE. The pixel electrode PE is electrically connected to the signal line S via the thin-film transistor TR. Note that each pixel PX may include two or more thin-film transistors TR. Further, to each of the pixels PX, a signal may be supplied via any line other than the scanning line G and the signal line S.

The thin-film transistor TR of the pixel PX is switched between a conductive state (on state) and a nonconductive state (off state) by a control signal which is supplied from the scanning line drive circuit GD via the scanning line G. A video signal which is output from the signal line drive circuit SD is supplied to the corresponding pixel electrode PE via the signal line S and the pixel's thin-film transistor TR in the conductive state.

The scanning line drive circuit GD and the signal line drive circuit SD are arranged in the non-display area. Each of the scanning line drive circuit GD and the signal line drive circuit SD includes a plurality of thin-film transistors TR which respectively function as switching elements.

Figure 2:
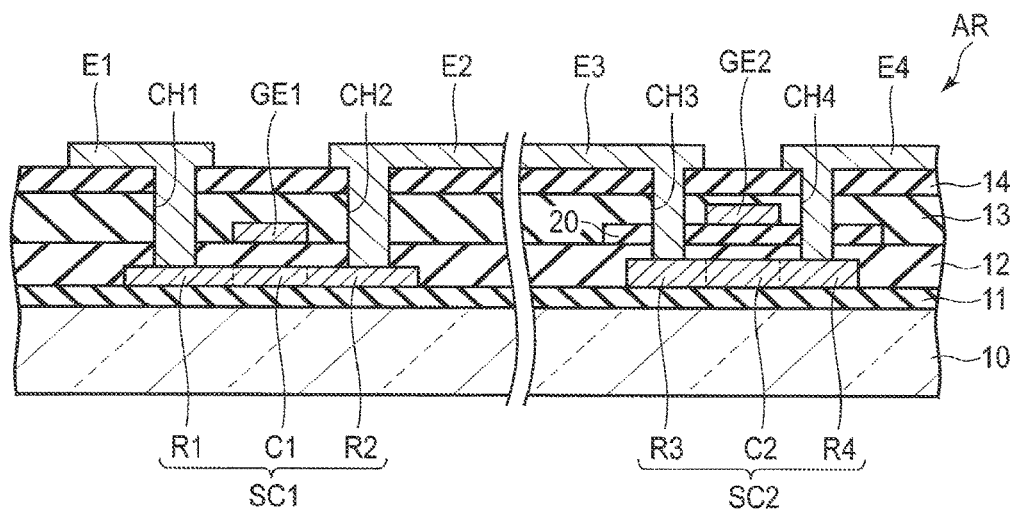
FIG. 2 is a sectional view of a part of the display device, showing a thin-film transistor.

FIG. 2 is a schematic view of a part of the array substrate AR of the display device 1 of the present embodiment, showing the thin-film transistor TR. Note that the drawing only shows the essential parts of the array substrate AR. The thin-film transistor TR shown in FIG. 1 is composed of either one of a first thin-film transistor TR1 and a second thin-film transistor TR2 shown in FIG. 2.

As shown in FIG. 2, the first thin-film transistor TR1 and the second thin-film transistor TR2 are formed above the main surface of an insulating substrate 10 of the array substrate AR and function as switching elements, respectively. The first thin-film transistor TR1 includes a first semiconductor layer SC1, a second insulating film 12, a first gate electrode GE1, a first electrode E1, and a second electrode E2. The second thin-film transistor TR2 includes a second semiconductor layer SC2, a second insulating film 12, a second gate electrode GE2, a third electrode E3, and a fourth electrode E4.

The first insulating substrate 10 is formed of a material such as glass or resin. The first insulating film 11 is arranged above the first insulating substrate 10. Here, the main surface of the first insulating substrate 10 is parallel to an X-Y plane defined by the first direction X and the second direction Y which are orthogonal to each other. In the present embodiment, the first insulating film 11 is arranged on the first insulating substrate 10, but this is in no way restrictive. For example, another insulating film may be arranged between the first insulating substrate 10 and the first insulating film 11.

Both the first semiconductor layer SC1 and the second semiconductor layer SC2 are located above the first insulating film 11.

The first semiconductor layer SC1 is formed of polycrystalline silicon. The first semiconductor layer SC1 includes a first region R1, a second region R2, and a first channel region C1. The first channel region C1 is located between the first region R1 and the second region R2. As compared to the first channel region C1, the first region R1 and the second region R2 have low resistance. This is because, in the present embodiment, the impurity concentration of each of the first region R1 and the second region R2 is set to be greater than the impurity concentration of the first channel region C1. Further, one of the first region R1 and the second region R2 functions as a source region, and the other one of the first region R1 and the second region R2 functions as a drain region.

The second semiconductor layer SC2 is formed of an oxide semiconductor. Examples of the oxide semiconductor are an oxide of at least one of indium, gallium and zinc. Typical examples of the oxide semiconductor are an indium gallium zinc oxide (IGZO), an indium gallium oxide (IGO), an indium zinc oxide (IZO), a zinc tin oxide (ZnSnO), a zinc oxide (ZnO), and a transparent amorphous oxide semiconductor (TAOS). In the present embodiment, the second semiconductor layer SC2 is formed of a TAOS.

The second semiconductor layer SC2 includes a third region R3, a fourth region R4, and a second channel region C2. The second channel region C2 is located between the third region R3 and the fourth region R4. As compared to the second channel region C2, the third region R3 and the fourth region R4 have low resistance. This is because, in the present embodiment, the impurity concentration of each of the third region R3 and the fourth region R4 is set to be greater than the impurity concentration of the second channel region C2. Further, one of the third region R3 and the fourth region R4 functions as a source region, and the other one of the third region R3 and the fourth region R4 functions as a drain region.

Note that the method of reducing the resistance of the third region R3 and the fourth region R4 is not limited to any particular method but may be any well-known method. For example, in the process of reducing the resistance of the first region R1 and the second region R2, and the third region R3 and the fourth region R4, it is possible to perform the process simultaneously by using an impurity injection method (ion implantation method).

The second insulating film 12 is arranged on the first insulating film 11, the first semiconductor layer SC1, and the second semiconductor layer SC2.

The first gate electrode GE1 is located above the second insulating film 12 and is opposed to the first semiconductor layer SC1. In the present embodiment, the first gate electrode GE1 is located above the second insulating film 12 and is opposed to the first channel region C1.

The second gate electrode GE2 is located above the second insulating film 12 and is opposed to the second semiconductor layer SC2. In the present embodiment, the second gate electrode GE2 is located on a protection layer 20 which will be described later and is opposed to the second channel region C2.

Note that the above-described scanning line G is also arranged on the second insulating film 12. Therefore, together with the scanning line G, the first gate electrode GE1 and the second gate electrode GE2 are formed of the same material as each other and provided in the same layer as each other.

The third insulating film 13 is located above the second insulating film 12, the first gate electrode GE1 and the second gate electrode GE2. The fourth insulating film 14 is located on the third insulating film 13. The first insulating film 11, the second insulating film 12, the third insulating film 13 and the fourth insulating film 14 are formed of inorganic insulating materials such as silicon oxide (SiO) and silicon nitride (SiN). In the present embodiment, the first insulating film 11 and the second insulating film 12 are formed of oxides. More specifically, the first insulating film 11 is formed of SiO, the second insulating film 12 is formed of SiO by silane-based gas treatment, the third insulating film 13 is formed of SiN, and the fourth insulating film 14 is formed of SiO.

The protection layer 20 is located between the second insulating film 12 and the third insulating film 13 and is opposed to the second semiconductor layer SC2. In the present embodiment, the protection layer 20 is formed of an aluminum oxide (AlOX). The protection layer 20 is located between the second insulating film 12 and the second gate electrode GE2. Note that, unlike the present embodiment, the protection layer 20 may also be located on the second gate electrode GE2. In that case, the second gate electrode GE2 will be located between the second insulating film 12 and the protection layer 20. The protection layer 20 has the property of blocking hydrogen from the second insulating film 12. The hydrogen concentration in the protection layer 20 is less than the hydrogen concentration in the third insulating film 12.

In view of the X-Y plane, it is preferable that the area of the protection layer 20 should be greater than or equal to the area of the second semiconductor layer SC2 and that the protection layer 20 should completely cover the second semiconductor layer SC2.

Figure 3:
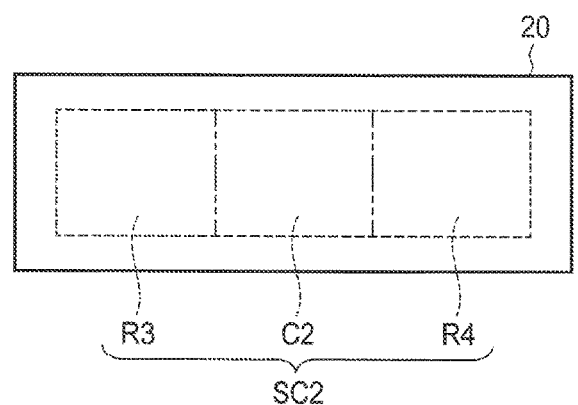
FIG. 3 is a plan view of a part of a second thin-film transistor shown in FIG. 2, showing a second semiconductor layer and a protection layer.

As shown in FIG. 3, in the present embodiment, the area of the protection layer 20 is greater than the area of the second semiconductor layer SC2, and the protection layer 20 completely covers the second semiconductor layer SC2. Therefore, the outline of the second semiconductor layer SC2 does not extend off the outline of the protection layer 20.

As shown in FIG. 2, the first electrode E1, the second electrode E2, the third electrode E3 and the fourth electrode E4 are located above the third insulating film 13 and are all arranged in the same layer as each other. In the present embodiment, the first electrode E1, the second electrode E2, the third electrode E3, and the fourth electrode E4 are arranged on the fourth insulating film 14.

The first electrode E1 is connected to the first region R1 through a first contact hole CH1 which is formed in the second insulating film 12, the third insulating film 13, and the fourth insulating film 14. The second electrode E2 is connected to the second region R2 through a second contact hole CH2 which is formed in the second insulating film 12, the third insulating film 13, and the fourth insulating film 14. The third electrode E3 is connected to the third region R3 through a third contact hole CH3 which is formed in the second insulating film 12, the protection layer 20, the third insulating film 13, and the fourth insulating film 14. The fourth electrode E4 is connected to the fourth region R4 through a fourth contact hole CH4 which is formed in the second insulating film 12, the protection layer 20, the third insulating film 13, and the fourth insulating film 14.

According to the display device of the first embodiment having the above-described structure, the display device 1 includes the first thin-film transistor TR1 and the second thin-film transistor TR2. The first semiconductor layer SC1 and the second semiconductor layer SC2 are located in the same layer as each other. The first gate electrode GE1 and the second gate electrode GE2 are located in the same layer as each other. The first electrode E1, the second electrode E2, the third electrode E3, and the fourth electrode E4 are located in the same layer as each other. Even if the first thin-film transistor TR1 and the second thin-film transistor TR2 are arranged within the same circuit, the number of the manufacturing processes can be reduced. Therefore, the display device 1 which can suppress increasing cost of manufacturing can be obtained. Further, the structure of the first embodiment can also contribute to reduction in thickness of the display device 1.

The protection layer 20 does not cover the first semiconductor layer SC1. In the manufacturing process, when the first semiconductor layer SC1 is to be hydrogenated, the protection layer 20 does not block hydrogen from the third insulating film 13 (SiN) toward the first semiconductor layer SC1. Therefore, in the first semiconductor layer SC1, defects can be remedied by hydrogen termination.

In the meantime, the protection layer 20 covers the second semiconductor layer SC2. When the first semiconductor layer SC1 is to be hydrogenated, the protection layer 20 can block hydrogen from the third insulating film 13 (SiN) toward the second semiconductor layer SC2. The protection layer 20 can protect the second semiconductor layer SC2. In this way, it is possible to suppress change in the characteristics of the semiconductor layer SC2 and improve the reliability of the second thin-film transistor TR2.

From the above, the display device 1 which can suppress increasing cost of manufacturing can be obtained. Alternatively, the highly-reliable display device 1 can be obtained.

Next, the display device of the second embodiment will be described. The display device 1 of the present embodiment is basically formed in the same manner as that of the display device of the first embodiment except that the protection layer 20 is not formed of an aluminum oxide (AlOX) but is formed of fluorinated silicon nitride (SiN:F) and that the protection layer 20 is located on the second gate electrode GE2.

Figure 4:
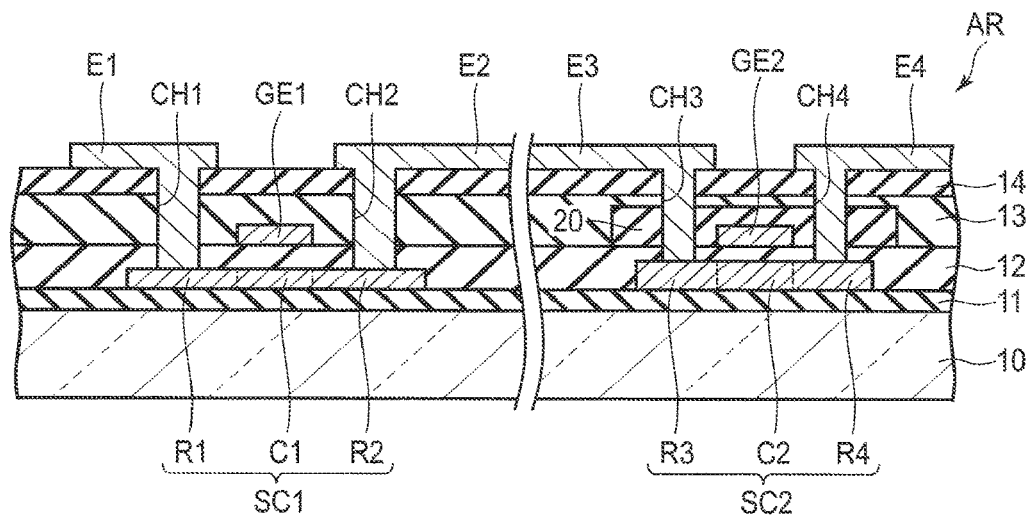
FIG. 4 is a sectional view of a part of a display device of a second embodiment, showing a thin-film transistor.

FIG. 4 is a sectional view of a part of the array substrate AR of the display device 1 of the present embodiment, showing the thin-film transistor TR. Note that the drawing only shows the essential parts of the array substrate AR.

As shown in FIG. 4, the second gate electrode GE2 is located on the second insulating film 12. The protection layer 20 is located on the second insulating film 12 and the second gate electrode GE2 and is opposed to the second semiconductor layer SC2. Note that, unlike the present embodiment, the protection layer 20 may also be located between the second insulating film 12 and the second gate electrode GE2. The protection layer 20 is formed of fluorinated silicon nitride. The protection layer 20 has the property of blocking hydrogen from the second insulating film 12. The hydrogen concentration in the protection layer 20 is less than the hydrogen concentration in the third insulating film 13. Further, the fluorine (F) concentration in the protection layer 20 is ten times or more the fluorine concentration in the third insulating film 13 (SiN).

In view of the X-Y plane, it is preferable that the area of the protection layer 20 should be greater than or equal to the area of the second semiconductor layer SC2 and that the protection layer 20 should completely cover the second semiconductor layer SC2.

Figure 5:
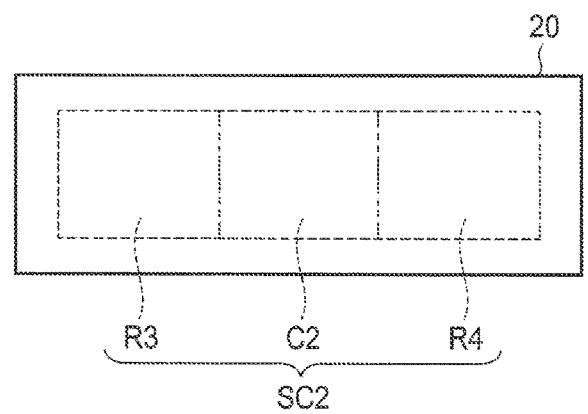
FIG. 5 is a plan view of a part of a second thin-film transistor shown in FIG. 4, showing a second semiconductor and a protection layer.

As shown in FIG. 5, in the present embodiment, the area of the protection layer 20 is greater than the area of the second semiconductor layer SC2, and the protection layer 20 completely covers the second semiconductor layer SC2.

According to the display device of the second embodiment having the above-described structure, the display device 1 includes the first thin-film transistor TR1 and the second thin-film transistor TR2. Also in the present embodiment, the second semiconductor layer SC2 of the second thin-film transistor TR2 is protected by the protection layer 20. Therefore, the display device 1 of the present embodiment can obtained the same advantage as that achieved from the display device of the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above-described embodiments, a display device has been described as an example of the present invention. However, the above-described embodiments are not intended to limit the application of the present invention to the above-described display device, but encompass the application of the present invention to various other flat-panel display devices. Further, the above-described embodiments are also applicable to devices other than display devices such as various semiconductor devices each of which includes the first semiconductor layer SC1 and the second semiconductor layer SC2.

What is claimed is:

1. A semiconductor device comprising:
   a first insulating film;
   a first semiconductor layer located on the first insulating film and formed of polycrystalline silicon;
   a second semiconductor layer located on the first insulating film and formed of an oxide semiconductor;
   a second insulating film arranged on the first insulating film, the first semiconductor layer, and the second semiconductor layer;
   a first gate electrode located above the second insulating film and opposed to the first semiconductor layer;
   a second gate electrode located above the second insulating film and opposed to the second semiconductor layer;
   a third insulating film located above the second insulating film, the first gate electrode, and the second gate electrode and formed of silicon nitride; and
   a protection layer located between the second insulating film and the third insulating film, opposed to the second semiconductor layer, and formed of either an aluminum oxide or fluorinated silicon nitride.

2. The semiconductor device of claim 1, wherein the second gate electrode is located on the protection layer.

3. The semiconductor device of claim 1, wherein the protection layer is located on the second gate electrode.

4. The semiconductor device of claim 1, wherein in planar view, the protection layer has an area greater than or equal to an area of the second semiconductor layer and completely covers the second semiconductor layer.

5. The semiconductor device of claim 1, further comprising:
   a first electrode, a second electrode, a third electrode, and a fourth electrode which are located above the third insulating film and are formed in the same layer as each other,
   wherein
   the first semiconductor layer includes a first region, a second region, and a first channel region located between the first region and the second region,
   the second semiconductor layer includes a third region, a fourth region, and a second channel region located between the third region and the fourth region,
   the first electrode is connected to the first region through a first contact hole formed in the second insulating film and the third insulating film,
   the second electrode is connected to the second region through a second contact hole formed in the second insulating film and the third insulating film,
   the third electrode is connected to the third region through a third contact hole formed in the second insulating film and the third insulating film, and
   the fourth electrode is connected to the fourth region through a fourth contact hole formed in the second insulating film and the third insulating film.

6. The semiconductor device of claim 1, wherein the first insulating film and the second insulating film are formed of oxides.

7. A display device comprising:
   a plurality of scanning lines;
   a plurality of signal lines;
   a plurality of pixels, each of the pixels being defined by two adjacent scanning lines and two adjacent signal lines; and
   a thin-film transistor included in at least one of the pixels, wherein the thin-film transistor includes
   a first insulating film,
   a first semiconductor layer located on the first insulating film and formed of polycrystalline silicon,
   a second semiconductor layer located on the first insulating film and formed of an oxide semiconductor,
   a second insulating film arranged on the first insulating film, the first semiconductor layer, and the second semiconductor layer,
   a first gate electrode located above the second insulating film and opposed to the first semiconductor layer,
   a second gate electrode located above the second insulating film and opposed to the second semiconductor layer,
   a third insulating film located above the second insulating film, the first gate electrode, and the second gate electrode and formed of silicon nitride, and
   a protection layer located between the second insulating film and the third insulating film, opposed to the second semiconductor layer, and formed of either an aluminum oxide or fluorinated silicon nitride.

8. The display device of claim 7, wherein the second gate electrode is located on the protection layer.

9. The display device of claim 7, wherein the protection layer is located on the second gate electrode.

10. The display device of claim 7, wherein in planar view, the protection layer has an area greater than or equal to an area of the second semiconductor layer and completely covers the second semiconductor layer.

11. The display device of claim 7, wherein the thin-film transistor further includes
   a first electrode, a second electrode, a third electrode, and a fourth electrode which are located above the third insulating film and are formed in the same layer as each other,
   the first semiconductor layer including a first region, a second region, and a first channel region located between the first region and the second region,
   the second semiconductor layer including a third region, a fourth region, and a second channel region located between the third region and the fourth region,
   the first electrode connecting to the first region through a first contact hole formed in the second insulating film and the third insulating film,
   the second electrode connecting to the second region through a second contact hole formed in the second insulating film and the third insulating film,
   the third electrode connecting to the third region through a third contact hole formed in the second insulating film and the third insulating film, and
   the fourth electrode connecting to the fourth region through a fourth contact hole formed in the second insulating film and the third insulating film.

12. The display device of claim 7, wherein the first insulating film and the second insulating film are formed of oxides.

* * * * *